(12) United States Patent
Dishongh et al.

(10) Patent No.: US 6,797,085 B1
(45) Date of Patent: Sep. 28, 2004

(54) METALLURGICALLY ENHANCED HEAT SINK

(75) Inventors: Terrance Dishongh, Hillsboro, OR (US); Prateek Dujari, Portland, OR (US); Bin Lian, Hillsboro, OR (US); Damion Searls, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/677,701

(22) Filed: Sep. 28, 2000

(51) Int. Cl.⁷ .................................. C21D 6/04

(52) U.S. Cl. .................................... 148/577

(58) Field of Search ......................... 148/577

(56) References Cited

U.S. PATENT DOCUMENTS

| | | | | |
|---|---|---|---|---|
| 3,184,349 A | * | 5/1965 | Burwen .................. | 148/577 |
| 3,185,600 A | * | 5/1965 | Dullberg ................ | 148/577 |
| 4,961,987 A | * | 10/1990 | Okuno et al. .......... | 428/209 |
| 5,465,184 A | * | 11/1995 | Pickering et al. ...... | 360/97.01 |
| 2001/0035577 A1 | * | 11/2001 | Akram .................. | 257/706 |

* cited by examiner

*Primary Examiner*—Sikyin Ip
(74) *Attorney, Agent, or Firm*—Blakely, Sokoloff, Taylor & Zafman LLP

(57) ABSTRACT

A metallurgical process expands the grain structure in a heat sink from a fine grain to a coarse grain to improve the thermal conductivity of the heat sink. The temperature of the heat sink is raised to a level high enough to lead to a secondary re-crystallization grain growth in the metal alloy. The temperature of the heat sink is then gradually lowered to a cryogenic temperature and then immediately brought back up to ambient temperature to strengthen the material.

14 Claims, 2 Drawing Sheets

METALLURGICALLY ENHANCED HEAT SINK

FIELD OF THE INVENTION

The present invention relates generally to the field of electronic microcircuit fabrication and, more particularly, to a process of fabricating a metallurgically enhanced heat sink.

BACKGROUND

A typical microelectronic package includes an integrated circuit device (e.g., a silicon chip) mounted to a carrier substrate with an epoxy-based material disposed between the die and the substrate. A heat sink (e.g., aluminum or copper) is generally included in the package and has direct contact with the die so that heat generated by the die can dissipate by convection directly into the surrounding air.

However, as the industry moves towards faster and smaller microelectronic devices, effective heat management is becoming more difficult. For example, the miniaturization of microelectronic devices involves not only crowding an increasing number of circuits on to a single chip, but also reducing the overall chip package size. Although smaller devices are necessary for certain high-performance applications (e.g., hand-held computers, portable telecommunications equipment, and the like) these devices tend to generate more heat due to a higher integration of circuits. One problem associated with ineffective thermal management can cause the central portion of a die, secured to a substrate, to curve or bend. This may cause some of the electrical connections between the die and the substrate to separate. Another damaging effect caused by thermally induced curving includes cracking and/or breaking of the die. In this instance, tensile stresses occur in the outer layer of the die as it bends. If these stresses are greater than the fracture strength of the die, it chips or breaks. Moreover, as the temperature becomes very hot, the inner dielectric layer may melt and cut off the electrical connection leading to total failure of the device.

One method of solving this problem has been to make heat sinks more efficient. For example, by reducing the thermal resistance between the heat sink and the die (i.e., by using a heat conductive adhesive such as grease, phase changing material, or solder alloy to attach the die to the heat sink) the heat transfer process is improved. Another technique has been to fabricate heat sinks from materials such as kovar or other expensive alloys with higher thermal conductivity than more conventional materials such as aluminum and copper. Nevertheless, alloys such as kovar do not provide a cost effective packaging solution.

As the advances in microelectronic fabrication continue to yield even more densely packaged high power transistors that are operated at faster and faster clock speeds, the problems associated with heat generation and heat dissipation will only become more acute. Therefore, it would be advantageous to enhance the thermal conductivity of heat sinks.

BRIEF DESCRIPTION OF THE DRAWINGS

The present invention is illustrated by way of example, and not limitation, in the figures of the accompanying drawings in which like reference numerals refer to similar elements and which.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention. Accordingly, the specification and drawings are to be regarded in an illustrative rather than a restrictive sense.

The present invention provides for a process of constructing a heat sink fabricated from conventional material (e.g., aluminum) that is metallurgically treated to enhance its thermal conductivity. A heat sink is subjected to the appropriate thermal treatment to obtain a coarse grain structure. A conventional heat sink will display improved thermal conductivity with a coarse grain structure than with a fine one.

As is well known in the art of thermal dynamics, conduction is accomplished by the short range interaction of electrons and/or molecules. Heat may be conducted when the motions of energetic (hotter) molecules are passed on to nearby, less energetic (cooler) molecules. However, a more effective method of heat conduction is the migration of energetic free electrons. Aluminum, with a high free electron density, is a good thermal and electrical conductor. However, one obstruction to the movement of atomic and/or molecular species is the presence of grain boundaries, which hinders the movement of these species from one grain to another. If the number of grain boundaries that obstruct the movement of the atomic and/or molecular species were reduced (i.e., if a coarse grain structure were obtained), there would be a considerable improvement in the conductive properties of the material.

Although grain coarsening reduces the strength of the material, heat sinks are not dominant load bearing structures. Thus, a certain degree of grain coarsening may be achieved that strikes a balance between the desired strength of the heat sink and the enhanced thermal conductivity of the heat sink material.

Figure 1:
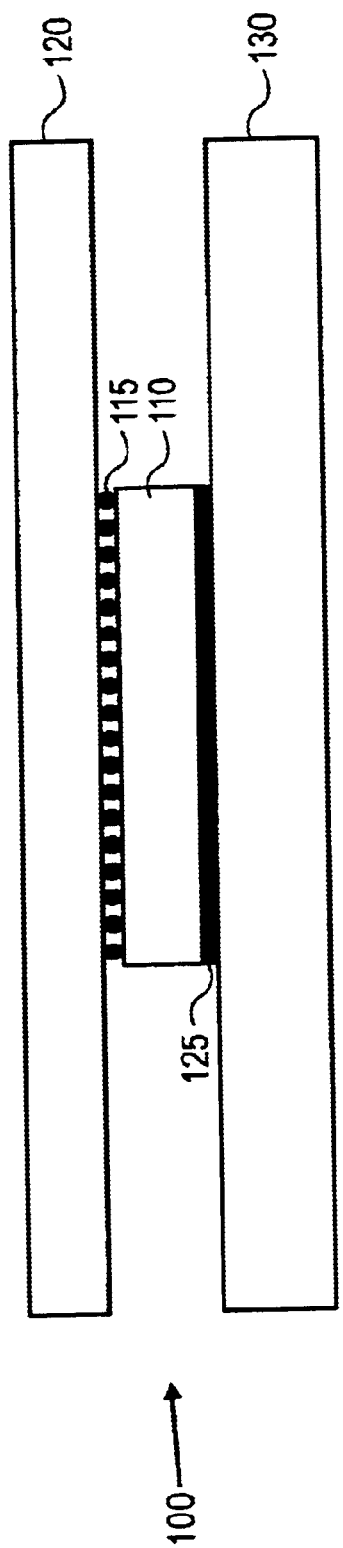
FIG. 1 is a schematic illustration of a conventional microelectronic package according to an embodiment of the present invention.

Referring now to FIG. 1, there is shown a schematic illustration of a conventional microelectronic package 100 in accordance with an embodiment of the present invention. A microelectronic die 110 (e.g., silicon or galium arsenite) is mounted to a package substrate 120 (e.g., organic or ceramic) using flip chip or C4 attachment ("Controlled Collapse Chip Connection") where an array of minute solder balls 115 on an active surface of the die 110 are aligned with an array of bond pads (not shown in this view) on an active surface of the package substrate 120. In other instances, the die 110 may be mounted to the substrate 120 using Chip-on-Flex ("COF") packaging (not shown in this view) where a flex component (i.e., the package substrate) is attached with an adhesive layer to an active surface of the die 110. Of course, various other types of electrical connections between the die 110 and the substrate 120 may also be used.

In the embodiment illustrated by FIG. 1, the substrate 120 may be fabricated of conventional laminates such as FR-4, fiberglass or bismaleimide-triazine (BT) material, of coated aluminum, or of alumina, ceramic, or other suitable material and includes multiple dielectric layers and multiple conductive layers (not shown in this view). Conductors on the substrate 120 may be formed of metals such as copper, aluminum, gold or silver, or by conductive inks formed by known technologies such as by thin-film or thick-film deposition.

A conventionally shaped heat sink 130 is thermally coupled to the backside of the die 110 using a heat conductive adhesive 125 (e.g., grease, phase changing material, solder, and the like). An advantage of using grease or phase changing material as the heat conductive adhesive 125 is that the integrity of the thermal interface bondline thickness between the die 110 and the heat sink 130 is always maintained. Of course, various other types of heat conductive adhesives may be used as well. In this example, the heat sink 130 is formed of aluminum. It will be appreciated by those skilled in the art that the present embodiment is readily applicable to heat sinks 130 of other component compositions, for example copper, titanium, and the like. In addition, although the heat sink 130 in the embodiment illustrated by FIG. 1 is comprised of a horizontal plane, the shape and size of the heat sink 130 is flexible.

Figure 2:
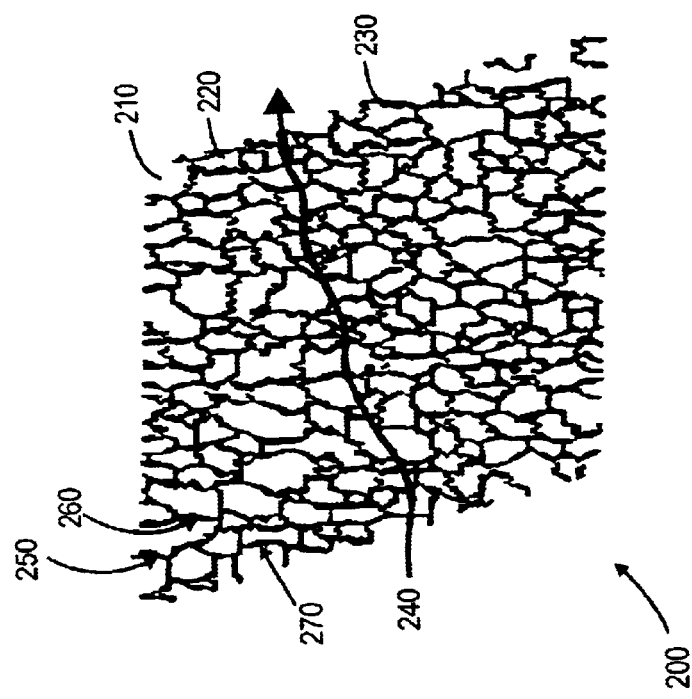
FIG. 2 is a schematic illustration of the grain structure of an aluminum alloy used in a conventional heat sink before a metallurgical process has been implemented according to an embodiment of the present invention.

Referring now to FIG. 2 there is shown a schematic illustration of the grain structure of an aluminum alloy before a metallurgical process has been implemented 200 according to an embodiment of the present invention. A fine grain structure 210, 220, 230, etc., throughout the thickness of the material obstructs the movement of atomic and/or molecular species 240 by the presence of numerous grain boundaries 250, 260, 270, etc. Although the aluminum alloy has a high free electron density (not shown in this view) and is thus a good thermal and electrical conductor, it would be helpful to reduce the number of grain boundaries 250, 260, 270, etc., in the material to enhance the movement of the atomic and/or molecular species 240.

Figure 3:
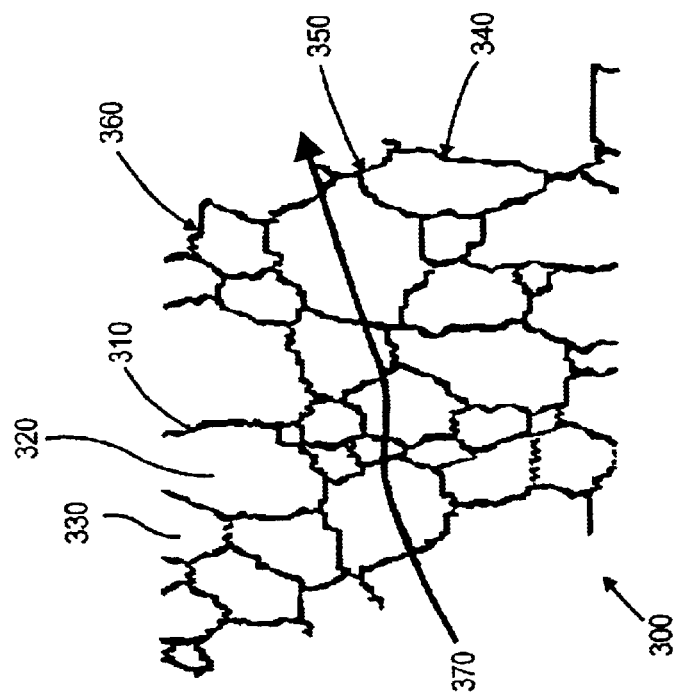
FIG. 3 is a schematic illustration of the grain structure of an aluminum alloy used in a heat sink after a metallurgical process has been implemented according to an embodiment of the present invention.

Referring now to FIG. 3 there is shown the grain structure of an aluminum alloy used in a heat sink that has undergone a metallurgical process 300 according to an embodiment of the present invention. The process of fabricating the heat sink includes changing the microstructure of the alloy to increase the size of the grain structure 310, 320, 330, etc. As is well known in the metallurgical arts, grain growth and coarsening in the aluminum alloy T6061 (a popular material for commercially available heat sinks) can be achieved by simply heating the aluminum in excess of 850.degree.F. to 900.degree.F. which will lead to a secondary re-crystallization grain growth. Of course, the process of the invention is not limited to the aluminum alloy T6061 and may be applicable to all aluminum alloys (or to any other alloys or metals used in the fabrication of heat sinks) which have precipitating constituents. Of course, care must be taken to develop a particular metallurgical process suitable for each alloy family.

In the next step of the process, the heat sink is subjected to a relatively slow reduction in temperature from room temperature (generally about 72.degree.F.) to an intermediate temperature (such as −100.degree.F.). For example, the material may be gradually cooled to the intermediate temperature by being suspended directly over an open container containing a bath of cryogenic material such as liquid nitrogen until an intermediate temperature is maintained throughout. The generally accepted standard well known in the metallurgical arts is to provide for a minimum of approximately one hour per inch cross section of the material to reach an intermediate temperature. The heat sink is then placed directly in the bath of liquid nitrogen, thereby attaining a quick reduction in the temperature of the heat sink to a cryogenic temperature (i.e., to about −327.degree.F. which is the temperature of the liquid nitrogen). Again, the accepted standard is to provide for a minimum of one hour per inch of cross section of the heat sink to reach the cryogenic temperature. Of course, other methods may be used, so long as the heat sink reaches the appropriate cryogenic temperature.

In the conventional cryogenic quenching process, the material is then gradually brought back up to room temperature to enhance various qualities of the material (such as hardness, stability, etc.). In the present embodiment, the cryogenic quenching process involves bringing the temperature of the heat sink immediately up to room temperature after the cryogenic treatment. The coarse grain structure 310, 320, 330, etc., of the heat sink that is attained by the cryogenic quenching process is thus retained, reducing the number of grain boundaries 340, 350, 360, etc., that obstruct the movement of the atomic and/or molecular species 370. As described herein, a reduction in grain boundaries 340, 350, 360, etc., leads to a considerable improvement in the thermal conductive properties of the aluminum.

Although the initial heat treatment (i.e., raising the aluminum in excess of 850.degree.F. to 900.degree.F.) weakens the aluminum by reducing the tensile and yield strength and may result in a roughening of the surface upon cooling back to room temperature, the cryogenic quenching process stress relieves the condition and helps strengthen the aluminum. Again, since the heat sink is not a dominantly load bearing structure, the reduction in material strength can be very well tolerated.

Although the description herein describes a cryogenic quenching process that involves immersing the material into a bath of liquid nitrogen, it should be understood that any type of cryogenic quenching process well known in the metallurgical arts may be used. For instance, the material may be treated in a cryogenic chamber or any other type of freezing apparatus.

In addition, many different tempering parameters may be utilized depending on the type of material used for the heat sinks, the size of the heat sink, and their configuration.

Thus, a process for metallurgically enhancing a heat sink has been described. Although the foregoing description and accompanying figures discuss and illustrate specific embodiments, it should be appreciated that the present invention is to be measured only in terms of the claims that follow.

What is claimed:

1. A method comprising:

heating a thermal dissipation device to an elevated temperature;

exposing the thermal dissipation device to a first medium to lower the temperature of the thermal dissipation device to an intermediate temperature;

after the intermediate temperature is maintained throughout the thermal dissipation device, exposing the thermal dissipation device to a second medium to lower the temperature of the thermal dissipation device to a cryogenic temperature, the cryogenic temperature being below the intermediate temperature;

bringing the temperature of the thermal dissipation device up to an ambient temperature; and thermally connecting the thermal dissipation device to a microelectronic device to dissipate heat generated within the microelectronic device.

2. The method of claim 1, wherein said heating changes a microstructure of a material of the thermal dissipation device from a fine grain structure to a coarse grain structure, the fine grain structure corresponding to a first thermal conductivity, the coarse grain structure corresponding to a second thermal conductivity, the second thermal conductivity being greater than the first thermal conductivity, the microstructure of the material maintaining the coarse grain structure after the temperature of the thermal dissipation device is brought up to the ambient temperature.

3. The method of claim 2, wherein the material is a metal.

4. The method of claim 3, wherein the metal is at least one of aluminum and copper.

5. The method of claim 4, wherein the thermal dissipation device is a heat sink.

6. The method of claim 5, wherein the microelectronic device is a microelectronic die mounted to a package substrate.

7. The method of claim 6, wherein the intermediate temperature is approximately −100 degrees Fahrenheit.

8. The method of claim 7, wherein the cryogenic temperature is approximately −327 degrees Fahrenheit.

9. The method of claim 8, wherein the first medium is air directly over a container containing a bath of a cryogenic material.

10. The method of claim 9, wherein the second medium is the bath of cryogenic material.

11. The method of claim 10, wherein the cryogenic material is liquid nitrogen.

12. A method comprising:

changing a microstructure of a material of a thermal dissipation device from having a first number of grain boundaries to having a second number of grain boundaries by heating the material to an elevated temperature, the first number of grain boundaries corresponding to a first thermal conductivity, the second number of grain boundaries corresponding to a second thermal conductivity, the second thermal conductivity being higher than the first thermal conductivity;

lowering the temperature of the material to an intermediate temperature at a first rate;

after the intermediate temperature is maintained throughout the material, lowering the temperature of the material to a cryogenic temperature at a second rate, the cryogenic temperature being below the intermediate temperature;

bringing the temperature of the material up to an ambient temperature, the microstructure of the material maintaining the second number of grain boundaries; and thermally connecting the thermal dissipation device to microelectronic device to dissipate heat generated within the microelectronic device.

13. The method of claim 12, wherein the second rate is higher than the first rate.

14. The method of claim 13, wherein the thermal dissipation device is a heat sink, the material is metal, and the microelectronic device is a microelectronic die mounted to a package substrate.

* * * * *